(12) United States Patent
Lin

(10) Patent No.: US 11,569,285 B2
(45) Date of Patent: Jan. 31, 2023

(54) SOLID-STATE IMAGING DEVICE HAVING A WAVEGUIDE PARTITION GRID WITH VARIABLE GRID WIDTHS

(71) Applicant: VisEra Technologies Company Limited, Hsin-Chu (TW)

(72) Inventor: Chi-Han Lin, Zhubei (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 347 days.

(21) Appl. No.: 16/872,605

(22) Filed: May 12, 2020

(65) Prior Publication Data
US 2021/0358985 A1 Nov. 18, 2021

(51) Int. Cl.
*H01L 27/146* (2006.01)
*G02B 5/20* (2006.01)
*G02B 7/28* (2021.01)
*G02B 1/11* (2015.01)

(52) U.S. Cl.
CPC .......... *H01L 27/14625* (2013.01); *G02B 1/11* (2013.01); *G02B 5/201* (2013.01); *G02B 7/28* (2013.01); *H01L 27/14621* (2013.01); *H01L 27/14645* (2013.01)

(58) Field of Classification Search
CPC ................................................ H01L 27/14625
See application file for complete search history.

(56) References Cited

U.S. PATENT DOCUMENTS

| 11,102,431 B2 * | 8/2021 | Jo ......................... H04N 17/02 |
| 2005/0142689 A1 | 6/2005 | Kim | |
| 2011/0102651 A1 | 5/2011 | Tay | |
| 2012/0235266 A1 | 9/2012 | Ootsuka | |
| 2017/0025458 A1 * | 1/2017 | Lin .................... H01L 27/14645 |
| 2017/0077163 A1 * | 3/2017 | Chou ................ H01L 27/14605 |
| 2018/0301491 A1 | 10/2018 | Nakamoto et al. | |
| 2019/0252440 A1 | 8/2019 | Chien et al. | |
| 2020/0045223 A1 * | 2/2020 | Pang ..................... H04N 5/3696 |

FOREIGN PATENT DOCUMENTS

| JP | 2013510424 A | 3/2013 |
| WO | WO-2017073321 A1 | 5/2017 |

OTHER PUBLICATIONS

Office Action dated May 5, 2021 in TW Application No. 109126331, 4 pages.

* cited by examiner

*Primary Examiner* — Suberr L Chi
(74) *Attorney, Agent, or Firm* — Muncy, Geissler, Olds & Lowe, P.C.

(57) ABSTRACT

A solid-state imaging device having a first area and a second area surrounding the first area is provided. The solid-state imaging device includes a substrate having a plurality of photoelectric conversion elements. The solid-state imaging device also includes a color filter layer disposed on the substrate. The color filter layer includes a plurality of color filter segments corresponding to the plurality of photoelectric conversion elements. The solid-state imaging device further includes an optical waveguide layer over the color filter layer. The optical waveguide layer includes a waveguide partition grid, a waveguide material in spaces of the waveguide partition grid, and an anti-reflection film on the waveguide partition grid and the waveguide material. The width of the top of the waveguide partition grid is larger than the width of the bottom of the waveguide partition grid.

18 Claims, 10 Drawing Sheets

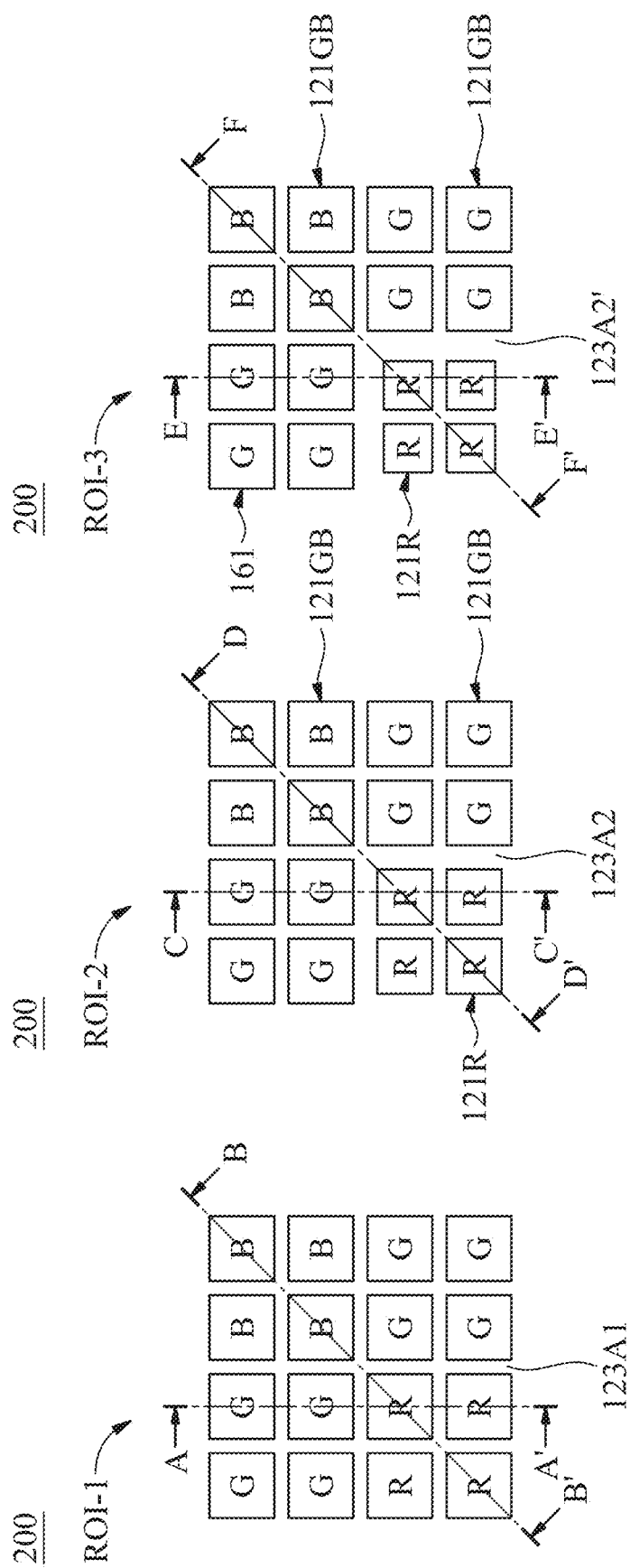

SOLID-STATE IMAGING DEVICE HAVING A WAVEGUIDE PARTITION GRID WITH VARIABLE GRID WIDTHS

BACKGROUND

Technical Field

The embodiments of the present disclosure relate to an imaging device, and in particular they relate to a solid-state imaging device that includes a waveguide partition grid having variable widths.

Description of the Related Art

Solid-state imaging devices, such as charge-coupled device (CCD) image sensors and complementary metal-oxide semiconductor (CMOS) image sensors, have been widely used in various image-capturing apparatuses such as digital still-image cameras, digital video cameras, and the like. In these solid-state imaging devices, a light-sensing portion is formed at each of a plurality of pixels, and signal electric charges are generated according to an amount of light received in the light sensing portion. In addition, the signal electric charges generated in the light sensing portion are transmitted and amplified, whereby an image signal is obtained.

Recently, the trend has been for the pixel size of solid-state imaging devices typified by CMOS image sensors to be reduced for the purpose of increasing the number of pixels to provide high-resolution images. However, while pixel size continues to decrease, there are still various challenges in the design and manufacturing of solid-state imaging devices.

BRIEF SUMMARY

In (or near) the edge area or the peripheral area of the solid-state imaging device, incident lights radiating into the solid-state imaging device may be oblique and the sensitivities of the photoelectric conversion elements may be non-uniform due to the different refractive indexes of the different color filter segments. In the embodiments of the present disclosure, the solid-state imaging device includes a waveguide partition grid having different grid widths, which may improve the uniformity of the pixel sensitivities in the edge area or the peripheral area of the solid-state imaging devices.

In accordance with some embodiments of the present disclosure, a solid-state imaging device having a first area and a second area surrounding the first area is provided. The solid-state imaging device includes a substrate having a plurality of photoelectric conversion elements. The solid-state imaging device also includes a color filter layer disposed on the substrate. The color filter layer includes a plurality of color filter segments corresponding to the plurality of photoelectric conversion elements. The solid-state imaging device further includes an optical waveguide layer over the color filter layer. The optical waveguide layer includes a waveguide partition grid, a waveguide material in spaces of the waveguide partition grid, and an anti-reflection film on the waveguide partition grid and the waveguide material. The width of the top of the waveguide partition grid is larger than the width of the bottom of the waveguide partition grid.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

FIG. 2A is a partial plane view illustrating area ROI-1 of the solid-state imaging device according to some embodiments of the disclosure.

FIG. 2B is a partial plane view illustrating area ROI-2 of the solid-state imaging device according to some embodiments of the disclosure.

FIG. 2C is a partial plane view illustrating area ROI-3 of the solid-state imaging device according to some embodiments of the disclosure.

DETAILED DESCRIPTION

Figure 1:
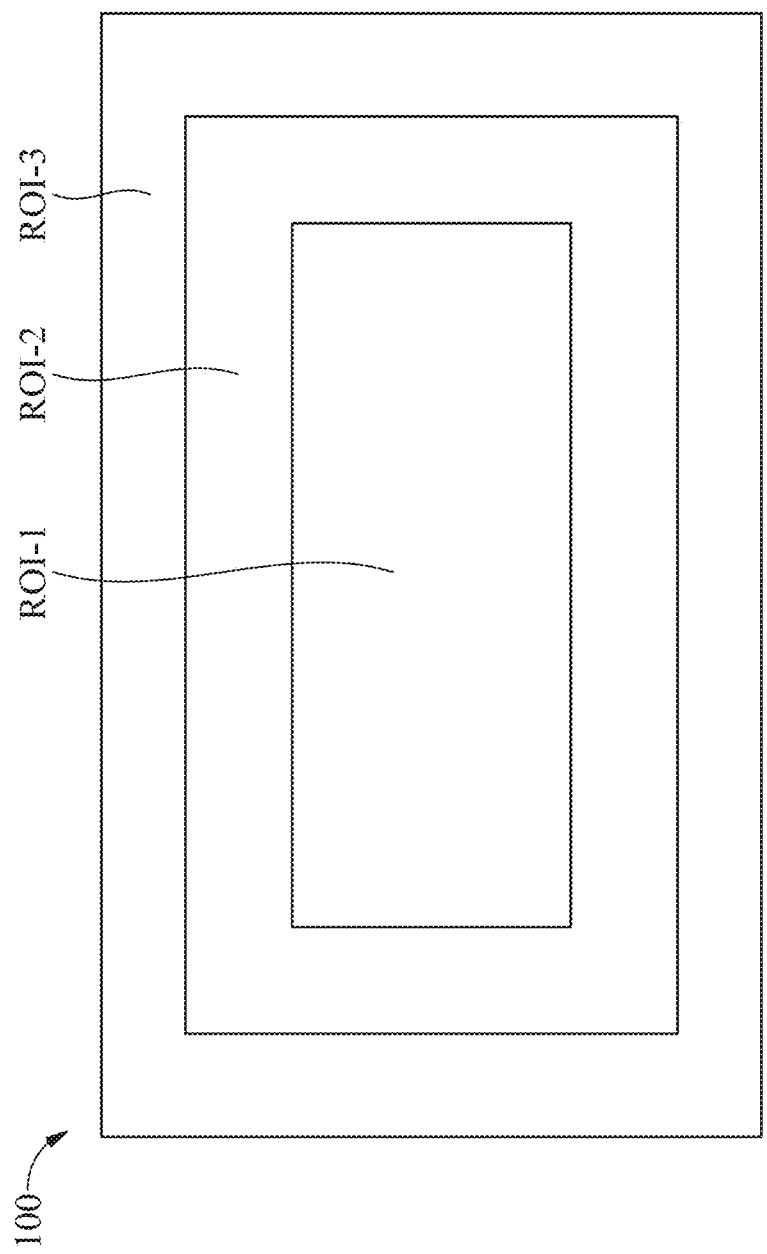
FIG. 1 is a top view illustrating a solid-state imaging device according to some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

In solid-state imaging devices, an incident light radiates onto the edges (peripheral area) of a pixel array at an oblique angle that is greater than a normal angle of the incident light radiating onto the central area of the pixel array. The angles of the incident light are determined from the normal line of a light-receiving surface of the solid-state imaging devices. For example, an oblique angle of an incident light radiating onto the edges (peripheral area) of the pixel array may be about +/−20 degrees to about +/−40 degrees, and the normal angle of the incident light radiating onto the central area of the pixel array may be about 0 degrees.

Solid-state imaging devices are roughly classified into two groups in terms of the direction of light incident on a light receiving unit. One is the front-side illuminated (FSI) imaging devices that receive light incident on the front side of a substrate on which the wiring layer of the reading circuit is formed. Another is the back-side illuminated (BSI) imaging devices that receive light incident on the back side of a semiconductor substrate on which no wiring layer is formed. For imaging a color image, a color filter is provided in the FSI and BSI imaging devices. The FSI and BSI imaging devices usually have a light-shielding grid structure for blocking light between pixels to prevent color mixture.

FIG. 1 is a top view illustrating a solid-state imaging device 100 according to some embodiments of the disclosure. Referring to FIG. 1, area ROI-1 represents a central area of the solid-state imaging device 100, area ROI-3 represents an edge area (peripheral area) of the solid-state imaging device 100, and area ROI-2 represents an area between area ROI-1 and area ROI-3. FIG. 1 shows the relative positions of area ROI-1, area ROI-2, and area ROI-3 of the solid-state imaging device 100. It should be noted that the relative positions of area ROI-1, area ROI-2, and area ROI-3 may also be applied in the following figures.

Figure 3A:
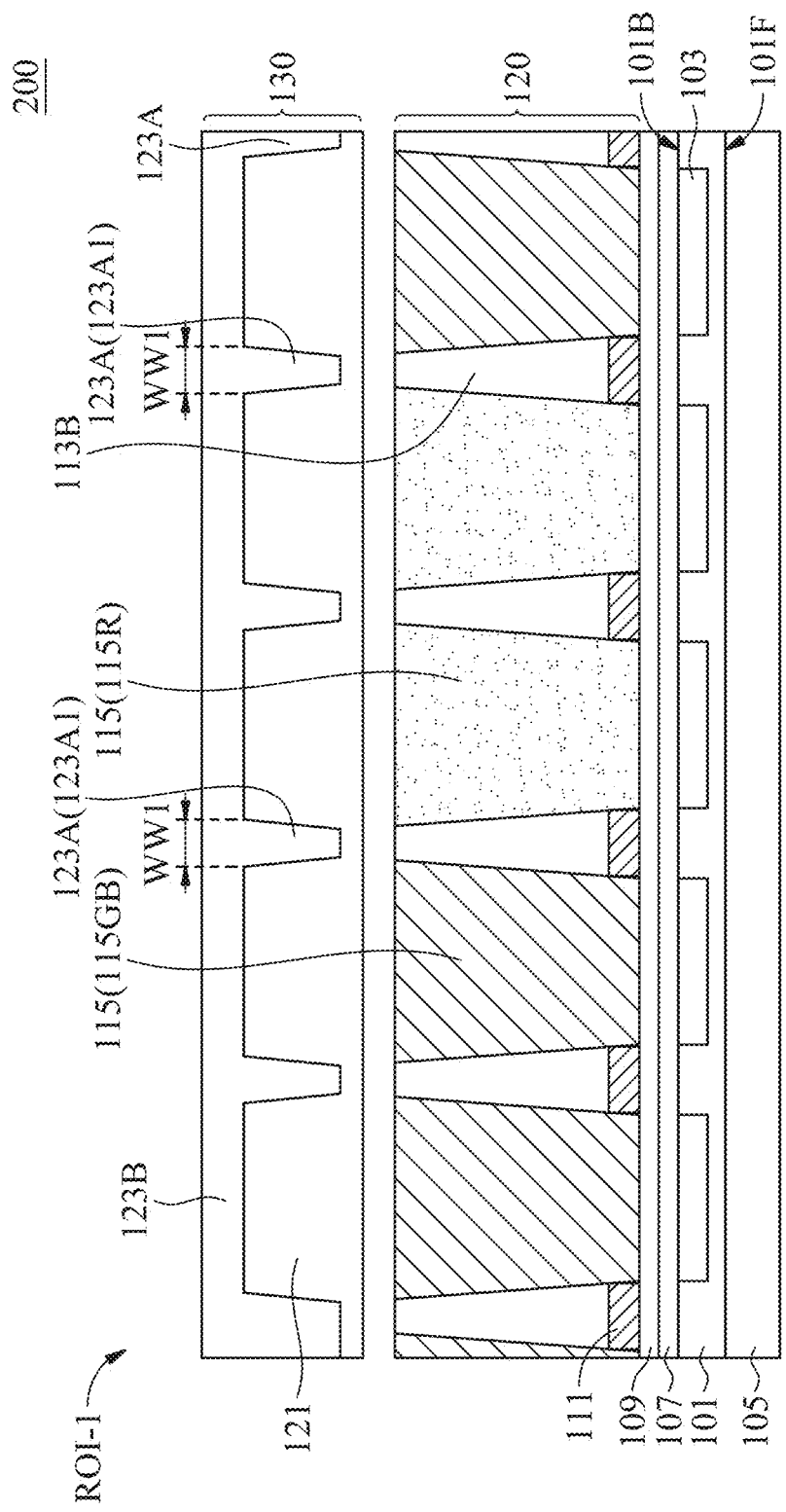
FIG. 3A is a partial cross-sectional view illustrating area ROI-1 of the solid-state imaging device according to some embodiments of the disclosure.
Figure 3B:
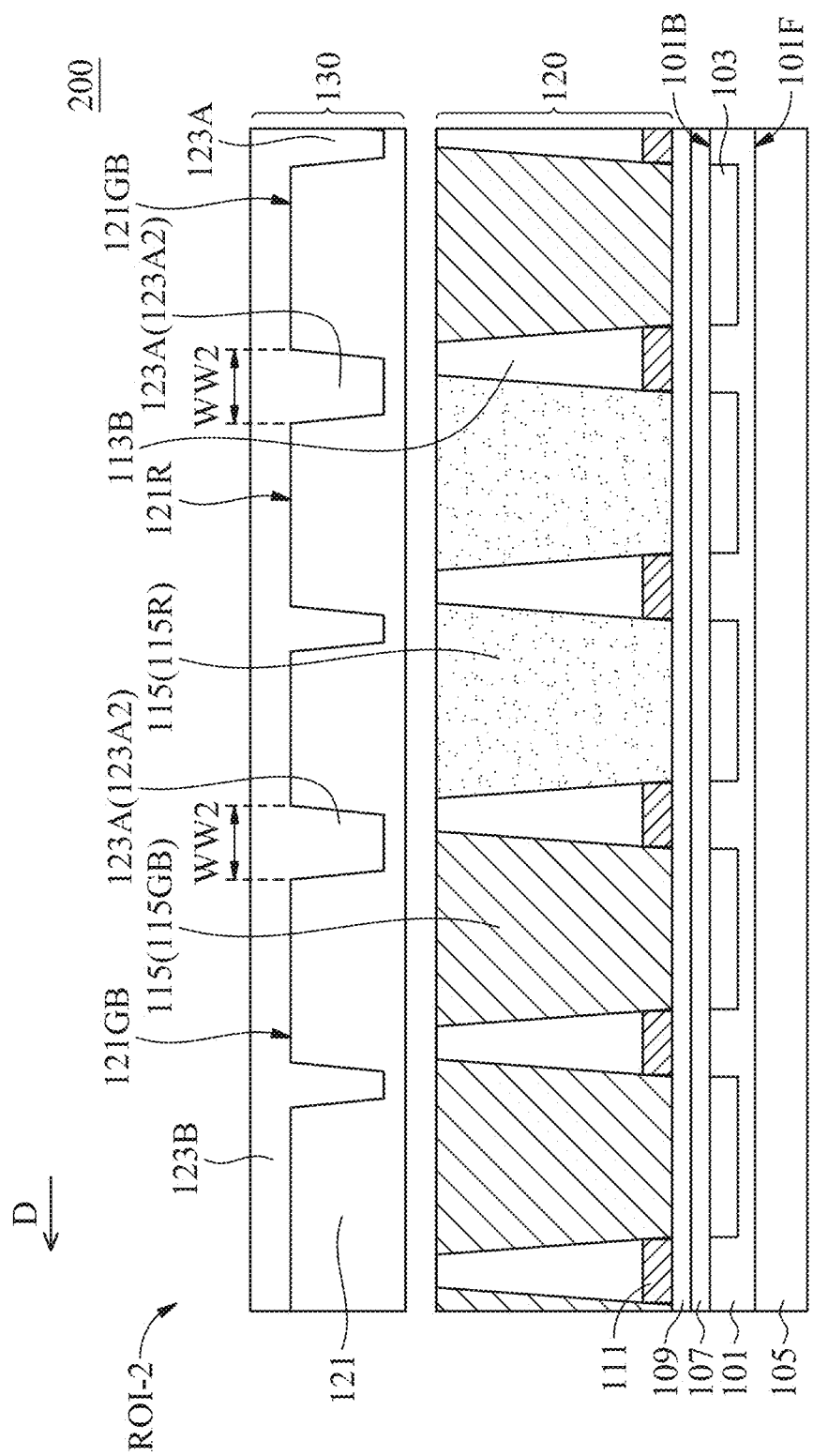
FIG. 3B is a partial cross-sectional view illustrating area ROI-2 of the solid-state imaging device according to some embodiments of the disclosure.
Figure 3C:
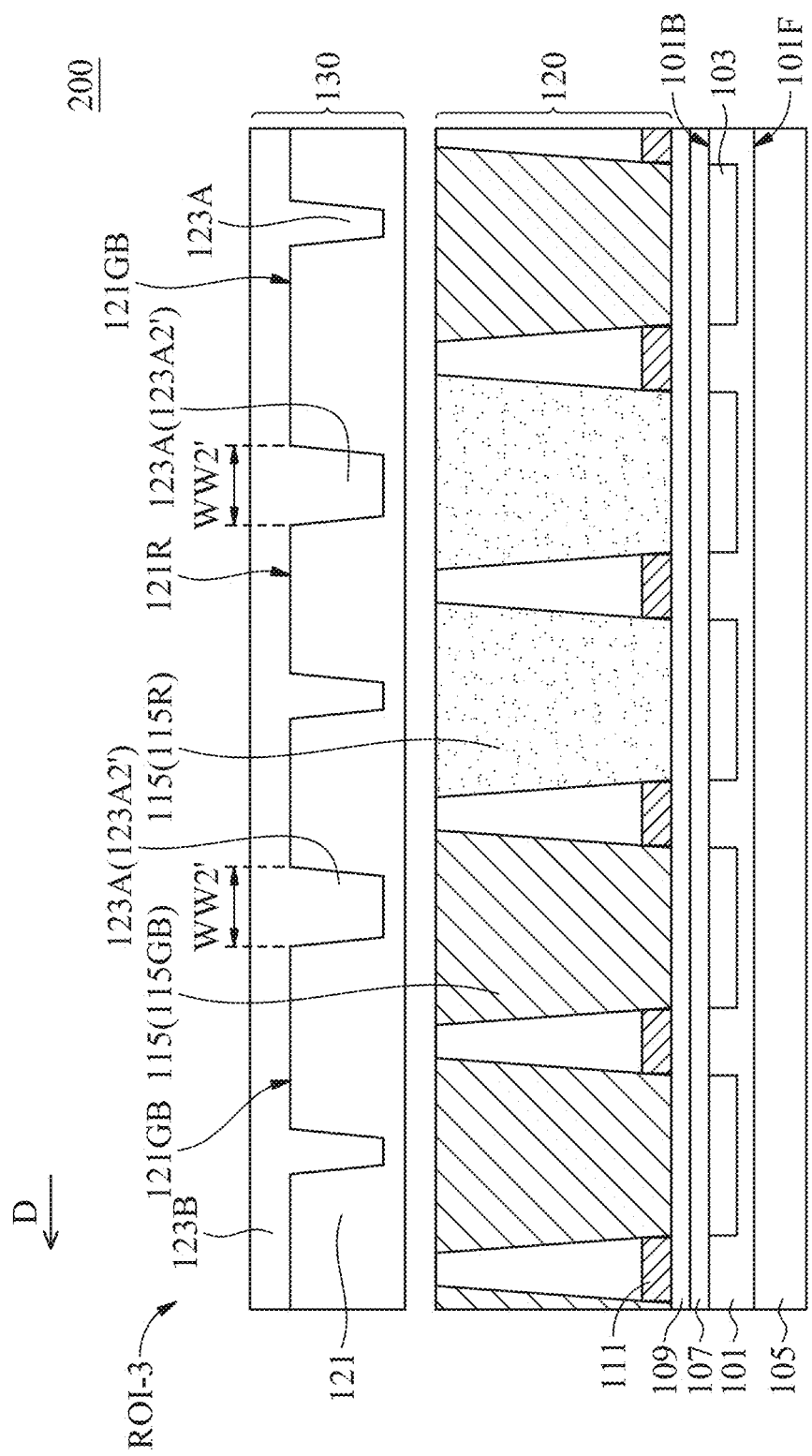
FIG. 3C is a partial cross-sectional view illustrating area ROI-3 of the solid-state imaging device according to some embodiments of the disclosure.

FIG. 2A is a partial plane view illustrating area ROI-1 of the solid-state imaging device 200 according to some embodiments of the disclosure. FIG. 2B is a partial plane view illustrating area ROI-2 of the solid-state imaging device 200 according to some embodiments of the disclosure. FIG. 2C is a partial plane view illustrating area ROI-3 of the solid-state imaging device 200 according to some embodiments of the disclosure. FIG. 3A is a partial cross-sectional view illustrating area ROI-1 of the solid-state imaging device 200 according to some embodiments of the disclosure. FIG. 3B is a partial cross-sectional view illustrating area ROI-2 of the solid-state imaging device 200 according to some embodiments of the disclosure. FIG. 3C is a partial cross-sectional view illustrating area ROI-3 of the solid-state imaging device 200 according to some embodiments of the disclosure.

In this embodiment, FIG. 3A may be the cross-sectional view of area ROI-1 of the solid-state imaging device 200 along line A-A' or line B-B' shown in FIG. 2A. Similarly, FIG. 3B may be the cross-sectional view of area ROI-2 of the solid-state imaging device 200 along line C-C' or line D-D' shown in FIG. 2B, and FIG. 3C may be the cross-sectional view of area ROI-3 of the solid-state imaging device 200 along line E-E' or line F-F' shown in FIG. 2C. The relative positions of area ROI-1, area ROI-2, and area ROI-3 in FIG. 2A to FIG. 3C may also be referred to in FIG. 1. It should be noted that some components of the solid-state imaging device 200 may be omitted in FIG. 2A to FIG. 3C for the sake of brevity.

In some embodiments, the solid-state imaging device 200 may be formed of a complementary metal-oxide semiconductor (CMOS) image sensor or a charge coupled device (CCD) image sensor, but the present disclosures is not limited thereto. As shown in FIG. 3A to 3C, the solid-state imaging device 200 includes a substrate 101 which may be, for example, a wafer or a chip, but the present disclosure is not limited thereto. The substrate 101 has a front surface 101F and a back surface 101B opposite to the front surface 101F. Multiple photoelectric conversion elements 103 (e.g., photodiodes) may be formed in the substrate 101.

Referring to FIG. 3A to FIG. 3C, the substrate 101 has a plurality of photoelectric conversion elements 103. The photoelectric conversion elements 103 in the substrate 101 may be isolated from each other by isolation structures (not shown) such as shallow trench isolation (STI) regions or deep trench isolation regions. The isolation structures may be formed in the substrate 101 using etching process to form trenches and filling the trenches with an insulating or dielectric material. Although figures of the solid-state imaging devices of the embodiments show several pixels, actually the solid-state imaging devices have several million or more pixels in the pixel array.

In some embodiments, the photoelectric conversion elements 103 are formed on the back surface 101B of the substrate 101, and a wiring layer 105 is formed on the front surface 101F of the substrate 101, but the present disclosure is not limited thereto. The wiring layer 105 may be an interconnect structure that includes multiple conductive lines and vias embedded in multiple dielectric layers, and may further include various electric circuits required for the solid-state imaging device 200. Incident lights may radiate onto the side of the back surface 101B and be received by the photoelectric conversion elements 103. The solid-state imaging device 200 as shown in FIG. 3A to FIG. 3C is referred to as a back-side illuminated (BSI) imaging device, but the present disclosure is not limited thereto. In some other embodiments, the solid-state imaging device 200 may be a front-side illuminated (FSI) imaging device. The substrate 101 and the wiring layer 105 as shown in FIG. 3A to FIG. 3C may be inverted for FSI imaging device. In the FSI imaging device, incident lights radiate onto the side of the front surface 101F, pass through the wiring layer 105 and then are received by the photoelectric conversion elements 103 formed on the back surface 101B of the substrate 101.

As shown in FIG. 3A to FIG. 3C, in some embodiments, the solid-state imaging device 200 may also include a high dielectric-constant (high-κ) film 107 formed on the back surface 101B of the substrate 101 and covering the photoelectric conversion elements 103. The material of the high-κ film 107 may include hafnium oxide ($HfO_2$), hafnium tantalum oxide (HfTaO), hafnium titanium oxide (HMO), hafnium zirconium oxide (HfZrO), tantalum pentoxide ($Ta_2O_5$), other suitable high-κ dielectric materials, or a combination thereof, but the present disclosure is not limited thereto. The high-κ film 107 may be formed by a deposition process. The deposition process is, for example, chemical vapor deposition (CVD), plasma enhanced chemical vapor deposition (PECVD), atomic layer deposition (ALD), or another deposition technique. The high-κ film 107 may have a high-refractive index and a light-absorbing ability.

In some embodiments, the solid-state imaging device 200 may further include a buffer layer 109 formed on the high-κ film 107. The material of the buffer layer 109 may include silicon oxides, silicon nitrides, silicon oxynitrides, other suitable insulating materials, or a combination thereof, but the present disclosure is not limited thereto. The buffer layer 109 may be formed by a deposition process. The deposition process is, for example, spin-on coating, chemical vapor deposition, flowable chemical vapor deposition (FCVD), plasma enhanced chemical vapor deposition, physical vapor deposition (PVD), or another deposition technique.

Referring to FIG. 3A to FIG. 3C, the solid-state imaging device 200 also includes a color filter layer 120 disposed on the substrate 101 and above the photoelectric conversion elements 103. In more detail, the color filter layer 120 includes a metal grid 111 formed on the buffer layer 109 as shown in FIG. 3A to FIG. 3C, but the present disclosure is not limited thereto. In some embodiments, the material of the metal grid 111 may include tungsten (W), aluminum (Al), metal nitride (e.g., titanium nitride (TiN)), other suitable materials, or a combination thereof, but the present disclosure is not limited thereto. The metal grid 111 may be formed by depositing a metal layer on the buffer layer 109 and then patterning the metal layer using photolithography and etching processes to form a grid structure, but the present disclosure is not limited thereto.

Referring to FIG. 3A to FIG. 3C, the color filter layer 120 also includes a color filter partition grid 113B and a plurality of color filter segments 115. The color filter segments 115 correspond to the photoelectric conversion elements 103, and the color filter partition grid 113B is disposed between the color filter segments 115 and on the metal grid 111. In the embodiments of the present disclosure, the metal grid 111, the color filter partition grid 113B and the color filter segments 115 may collectively be referred to as the color filter layer 120. In particular, the color filter partition grid 113B may be formed on and cover at least a portion of the metal grid 111, and the color filter segments 115 may be disposed in the respective spaces of the color filter partition grid 113B. The material of the color filter partition grid 113B may include a transparent dielectric material that has a low refractive index in a range from about 1.0 to about 1.99, and the refractive index of the color filter partition grid 113B may be lower than the refractive indexes of the color filter segments 115, but the present disclosure is not limited thereto. Each color filter segment 115 may correspond to one respective photoelectric conversion element 103, but the present disclosure is not limited thereto.

Moreover, in some embodiments, the color filter segments 115 may include red (R) color filter segments 115R and green (G)/blue (B) color filter segments 115GB arrayed by a suitable arrangement as shown in FIG. 3A to FIG. 3C. In some other embodiments, the color filter segments 115 may further include white (W) or another color filter segment arrayed with red, green and blue color filter segments together in a suitable arrangement. The color filter segments 115 may have a top surface that is level with the top surface of the color filter partition grid 113B, but the present disclosure is not limited thereto.

Referring to FIG. 3A to FIG. 3C, the solid-state imaging device 200 further includes an optical waveguide layer 130 over the color filter layer 120. As shown in FIG. 3A to FIG. 3C, the optical waveguide layer 130 includes a waveguide partition grid 123A, a waveguide material 121 in spaces of the waveguide partition grid 123A (and disposed above the photoelectric conversion elements 103), and an anti-reflection film 123B on the waveguide partition grid 123A and the waveguide material 121. In more detail, the waveguide partition grid 123A may be disposed to correspond to the color filter partition grid 113B, the waveguide material 121 and the waveguide partition grid 123A have a coplanar top surface, and the anti-reflection film 123B is on the coplanar top surface as shown in FIG. 3A to FIG. 3C, but the present disclosures is not limited thereto.

In some embodiments, the material of the waveguide partition grid 123A may include a transparent dielectric material that has a low refractive index in a range from about 1.0 to about 1.99, and the material of the waveguide material 121 may include another transparent dielectric material having a refractive index that is higher than the refractive index of the waveguide partition grid 123A, but the present disclosure is not limited thereto. In some embodiments, the refractive index of the waveguide material 121 is in a range from about 1.1 to about 2.0. In some embodiments, the waveguide partition grid 123A and the anti-reflection film 123B may be made of the same material and formed together in the same process step, but the present disclosure is not limited thereto. In some other embodiments, the waveguide partition grid 123A and the anti-reflection film 123B may be formed in the different process steps.

In the embodiments of the present disclosure, the width of the top of the waveguide partition grid 123A may be larger than the width of the bottom of the waveguide partition grid 123A. That is, in the cross-sectional view of the solid-state imaging device 200 shown in FIG. 3A to FIG. 3C, the waveguide partition grid 123A may be formed as a plurality of trapezoids, but the present disclosure is not limited thereto.

In some embodiments, the waveguide partition grid 123A has a first waveguide portion 123A1 in area ROI-1 as shown in FIG. 2A and FIG. 3A, and a second waveguide portion 123A2 (or 123A2') corresponding to the first waveguide portion 123A1 in area ROI-2 (or area ROI-3). Moreover, the second waveguide width WW2 (or WW2') of the top of the second waveguide portion 123A2 (or 123A2') is greater than the first waveguide width WW1 of the top of the first waveguide portion 123A1. In this embodiment, the second waveguide width WW2' of the top of the second waveguide portion 123A2' is greater than the second waveguide width WW2 of the top of the second waveguide portion 123A2. That is, the second waveguide width WW2 of the top of the second waveguide portion 123A2 in area ROI-2 (i.e., between the central area and the edge area of the solid-state imaging device 200) or the second waveguide width WW2' of the top of the second waveguide portion 123A2' in area ROI-3 (i.e., the edge area of the solid-state imaging device 200) is greater than the first waveguide width WW1 of the top of the first waveguide portion 123A1 in area ROI-1 (i.e., the central area of the solid-state imaging device 200).

As shown in FIG. 2A, FIG. 2B, FIG. 3A and FIG. 3B, for example, the first waveguide width WW1 of the top of the first waveguide portion 123A1 may be in a range from about 0.15 μm to about 0.22 μm, while the second waveguide width WW2 of the top of the second waveguide portion 123A2 may be in a range from about 0.17 μm to about 0.24 μm, but the present disclosure is not limited thereto. Similarly, as shown in FIG. 2C and FIG. 3C, the second waveguide width WW2' of the top of the second waveguide portion 123A2' may be in a range from about 0.19 μm to about 0.26 μm, but the present disclosure is not limited thereto. In some embodiments, the ratio (WW2/WW1 or WW2'/WW1) of the second waveguide width WW2 (or WW2') of the top of the second waveguide portion 123A2 (or 123A2') to the first waveguide width WW1 of the top of the first waveguide portion 123A1 may be from about 1.05 to about 1.3, but the present disclosure is not limited thereto.

Furthermore, in the embodiment shown in FIG. 2A to FIG. 2C and FIG. 3A to FIG. 3C, the first waveguide portion 123A1 in area ROI-1 and the second waveguide portion 123A2 (or 123A2') in area ROI-2 (or in area ROI-3) enclose spaces corresponding to the red color filter segments 115R. Since the second waveguide width WW2 (or WW2') of the top of the second waveguide portion 123A2 (or 123A2') is greater than the first waveguide width WW1 of the top of the first waveguide portion 123A1, the top surface 121R of the waveguide material 121 corresponding to each of the red color filter segments 115R in area ROI-2 (i.e., between the central area and the edge area of the solid-state imaging device 200) or in area ROI-3 (i.e., the edge area of the solid-state imaging device 200) is smaller than the top surface of the waveguide material 121 corresponding to each of the red color filter segments 115R in area ROI-1 (i.e., the central area of the solid-state imaging device 200) as shown in FIG. 2A to FIG. 2C. As shown in FIG. 2B and FIG. 2C, the top surface 121R of the waveguide material 121 corresponding to each of the red color filter segments 115R is smaller than the top surface 121GB of the waveguide material 121 corresponding to each of the green color filter segments and/or blue color filter segments 115GB in area ROI-2 or in area ROI-3.

In some embodiments, the position of the waveguide partition grid 123A in area ROI-2 (i.e., between the central area and the edge area of the solid-state imaging device 200) or in area ROI-3 (i.e., the edge area of the solid-state imaging device 200) may be shifted with respect to the position of the color filter partition grid 113B by a shifting distance in a direction D. Here, the direction D is a horizontal direction that is on a plane parallel to the top surface of the color filter layer 120. The shifting distance may be adjusted based on sensitivity, channel separation, or another performance in area ROI-2 or in area ROI-3 of the solid-state imaging device 200. In some embodiments, the shifting distance of the waveguide partition grid 123A may be consistent, but the present disclosures in not limited thereto. In some other embodiments, the shifting distance of the waveguide partition grid 123A may be variable.

According to embodiments of the disclosure, an oblique incident light radiating into the solid-state imaging device 200 with shifting in the position of the waveguide partition grid 123A in area ROI-2 or in area ROI-3 may be guided into the color filter segment 115 and reach a position near the central area of the photoelectric conversion element 103. Therefore, the sensitivity in (or near) the edge area (peripheral area) of the solid-state imaging device 200 may be enhanced.

Furthermore, the red color filter segments 115R may have higher sensitivity than the green/blue color filter segments 115GB in area ROI-2 (i.e., between the central area and the edge area of the solid-state imaging device 200) or in area ROI-3 (i.e., the edge area of the solid-state imaging device 200) due to the higher refractive index. In the embodiments of the present disclosure, the second waveguide width WW2 (or WW2') of the top of the second waveguide portion 123A2 (or 123A2') is set to be greater than the first waveguide width WW1 of the top of the first waveguide portion 123A1, such that the difference of the sensitivities of the color filter segments 115 may be reduced. Therefore, the uniformity of the sensitivities in (or near) the edge area (peripheral area) of the solid-state imaging devices 200 may be improved.

Figure 4A:
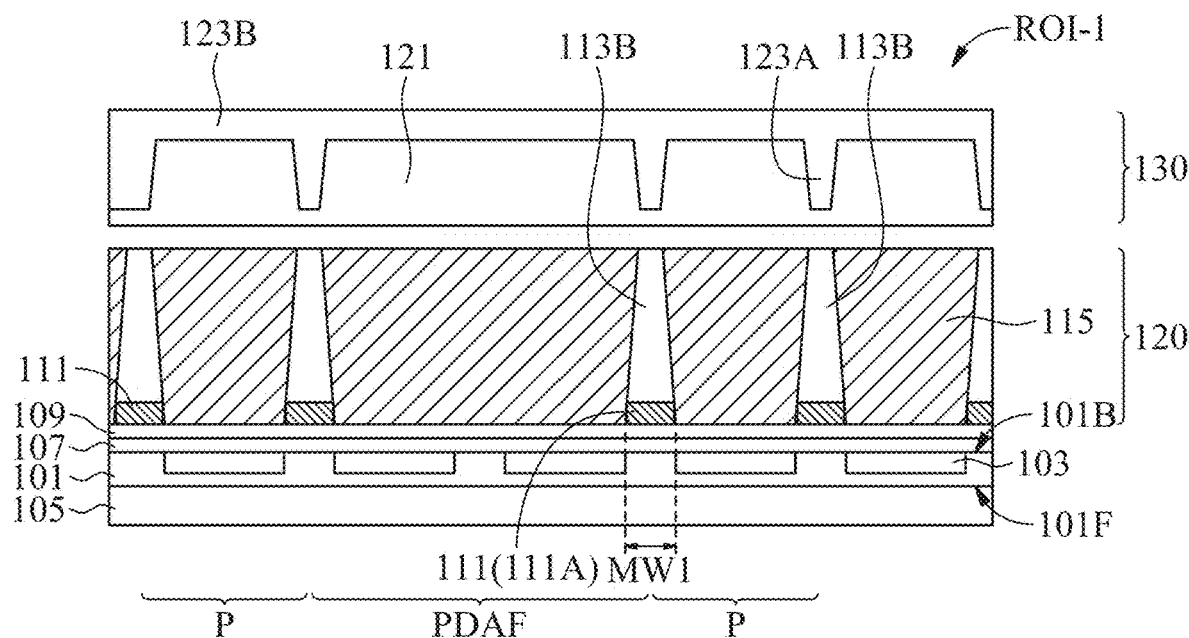
FIG. 4A is a partial cross-sectional view illustrating area ROI-1 of the solid-state imaging device according to some embodiments of the disclosure.
Figure 4B:
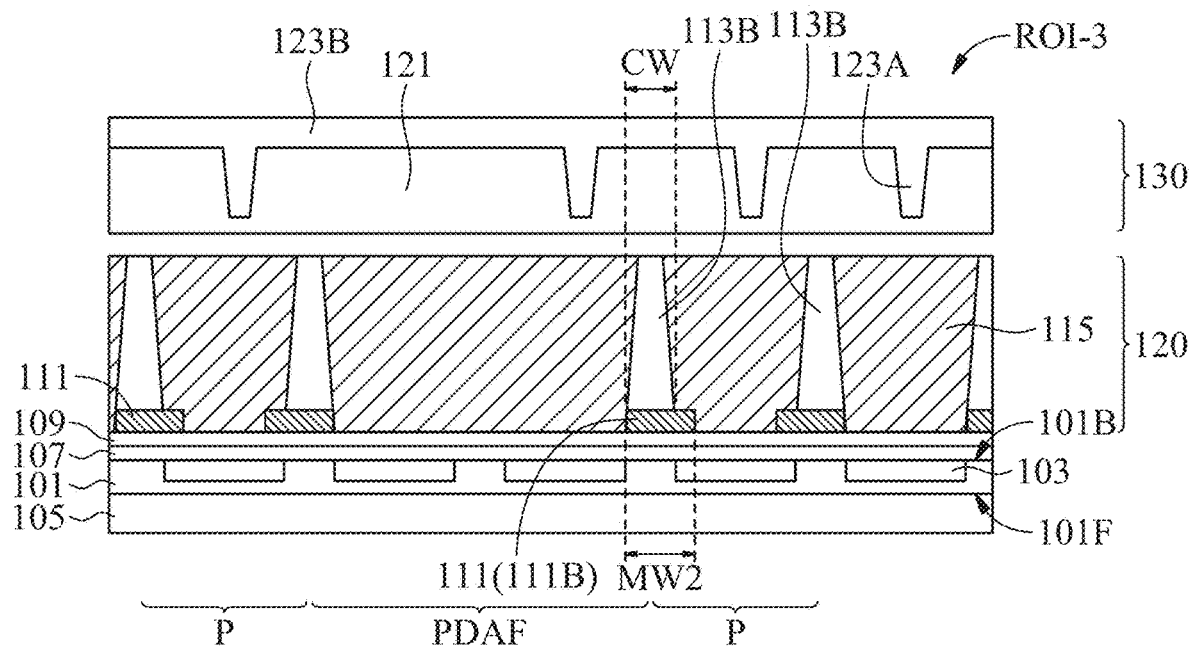
FIG. 4B is a partial cross-sectional view illustrating area ROI-3 of the solid-state imaging device according to some embodiments of the disclosure.

FIG. 4A is a partial cross-sectional view illustrating area ROI-1 of the solid-state imaging device 300 according to some embodiments of the disclosure. FIG. 4B is a partial cross-sectional view illustrating area ROI-3 of the solid-state imaging device 300 according to some embodiments of the disclosure. The relative positions of area ROI-1 and area ROI-3 in FIG. 4A and FIG. 4B may also be referred to in FIG. 1. It should be noted that some components of the solid-state imaging device 300 may be omitted in FIG. 4A and FIG. 4B for the sake of brevity.

Referring to FIG. 4A and FIG. 4B, in some embodiments, the photoelectric conversion elements 103 in the solid-state imaging device 300 may be arranged in a plurality of normal pixels P and a plurality of phase detection auto focus pixels PDAF surrounded by the normal pixels P. In some embodiments, each of the phase detection auto focus pixels PDAF may correspond to at least two of the photoelectric conversion elements 103, and each of the normal pixels P may correspond to one of the photoelectric conversion elements 103, but the present disclosure is not limited thereto.

In this embodiment, the metal grid 111 has different widths in different areas of the solid-state imaging device 300. For example, as shown in FIG. 4A and FIG. 4B, the metal grid 111 has a first metal portion 111A in area ROI-1 (i.e., the central area of the solid-state imaging device 300) and a second metal portion 111B corresponding to the first metal portion 111A in area ROI-3 (i.e., the edge area of the solid-state imaging device 300), but the present disclosure is not limited thereto. In some other embodiments, the second metal portion 111B of the metal grid 111 may also be disposed in area ROI-2 (i.e., between the central area and the edge area of the solid-state imaging device 300).

In this embodiment, the first metal portion 111A and the second metal portion 111B of the metal grid 111 correspond to spaces between one of the phase detection auto focus pixels PDAF and the corresponding normal pixels P (i.e., the normal pixels P surrounding the phase detection auto focus pixel PDAF). Moreover, the second metal width MW2 of the second metal portion 111B is greater than the first metal width MW1 of the first metal portion 111A. In more detail, the second metal portion 111B of the metal grid 111 may be partially below the color filter segments 115 corresponding the normal pixels P in area ROI-3 as shown in FIG. 4B. That is, the color filter segments 115 may cover part of the second metal portion 111B of the metal grid 111 in the normal pixels P as shown in FIG. 4B. Instead, the first metal portion 111A of the metal grid 111 may be fully covered by the color filter partition grid 113B in area ROI-1 as shown in FIG. 4A.

In some embodiments, the ratio (MW2/MW1) of the second metal width MW2 of the second metal portion 111B to the first metal width MW1 of the first metal portion 111A may be about 1.2 to about 1.75, but the present disclosure is not limited thereto.

Since the normal pixels P surrounding the phase detection auto focus pixel PDAF may have higher sensitivity than other normal pixels P in area ROI-3 (or in area ROI-2), the sensitivity in area ROI-3 (or in area ROI-2) may be non-balanced. In the embodiments of the disclosure, the second metal width MW2 of the second metal portion 111B is set to be greater than the first metal width MW1 of the first metal portion 111A, such that the difference of the sensitivities of the normal pixels P may be reduced. Therefore, the uniformity of the sensitivities in (or near) the edge area (peripheral area) of the solid-state imaging devices 300 may be improved.

In some embodiments, as shown in FIG. 4B, the color filter partition grid 113B has a grid width CW, and the grid width CW may be smaller than the second metal width MW2 of the second metal portion 111B in area ROI-3, but the present disclosure is not limited thereto.

Figure 5A:
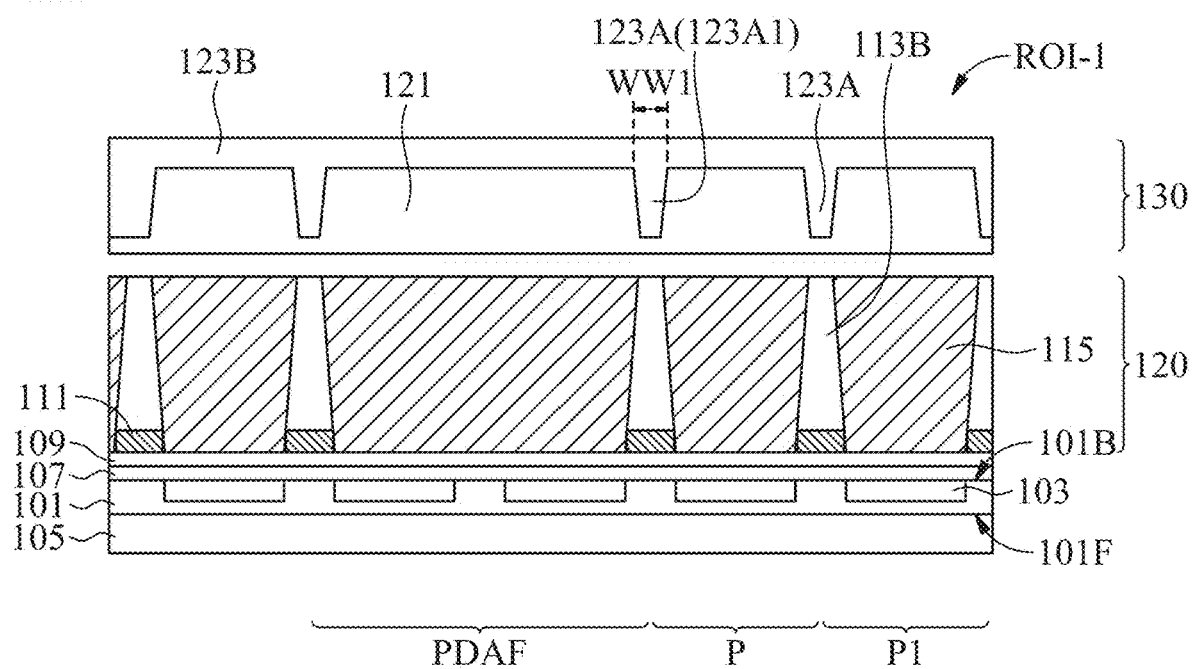
FIG. 5A is a partial cross-sectional view illustrating area ROI-1 of the solid-state imaging device according to some embodiments of the disclosure.
Figure 5B:
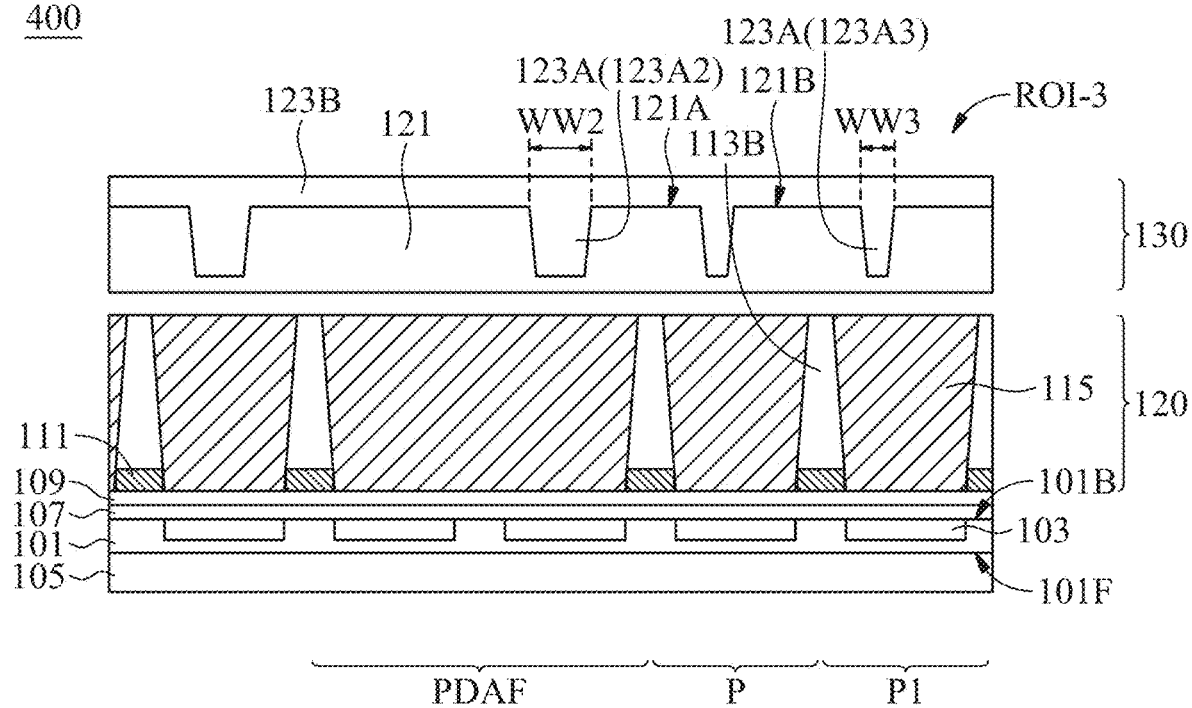
FIG. 5B is a partial cross-sectional view illustrating area ROI-3 of the solid-state imaging device according to some embodiments of the disclosure.

FIG. 5A is a partial cross-sectional view illustrating area ROI-1 of the solid-state imaging device 400 according to some embodiments of the disclosure. FIG. 5B is a partial cross-sectional view illustrating area ROI-3 of the solid-state imaging device 400 according to some embodiments of the disclosure. The relative positions of area ROI-1 and area ROI-3 in FIG. 5A and FIG. 5B may also be referred to in FIG. 1. It should be noted that some components of the solid-state imaging device 400 may be omitted in FIG. 5A and FIG. 5B for the sake of brevity.

Referring to FIG. 5A and FIG. 5B, in some embodiments, the photoelectric conversion elements 103 in the solid-state imaging device 400 may be arranged in a plurality of normal pixels P and a plurality of phase detection auto focus pixels PDAF surrounded by the normal pixels P. Similarly, each of the phase detection auto focus pixels PDAF may correspond to at least two of the photoelectric conversion elements 103, and each of the normal pixels P may correspond to one of the photoelectric conversion elements 103, but the present disclosure is not limited thereto.

As shown in FIG. 5A and FIG. 5B, in some embodiments, the photoelectric conversion elements 103 in the solid-state imaging device 400 may further be arranged in a plurality of additional normal pixels P1, and the additional normal pixels P1 are separated from the phase detection auto focus pixels PDAF by the normal pixels P.

In this embodiment, the waveguide partition grid 123A has different widths in different areas of the solid-state imaging device 400. For example, as shown in FIG. 5A and FIG. 5B, the waveguide partition grid 123A has a first waveguide portion 123A1 in area ROI-1 (i.e., the central area of the solid-state imaging device 400) and a second waveguide portion 123A2 corresponding to the first waveguide portion 123A1 in area ROI-3 (i.e., the edge area of the solid-state imaging device 400), but the present disclosure is not limited thereto. In some other embodiments, the second waveguide portion 123A2 of the waveguide partition grid 123A may also be disposed in area ROI-2 (i.e., between the central area and the edge area of the solid-state imaging device 400).

In this embodiment, the first waveguide portion 123A1 and the second waveguide portion 123A2 of the waveguide partition grid 123A correspond to spaces between one of the phase detection auto focus pixels PDAF and the corresponding normal pixels P (i.e., the normal pixels P surrounding the phase detection auto focus pixel PDAF). Moreover, the second waveguide width WW2 of the top of the second waveguide portion 123A2 is greater than the first waveguide width WW1 of the top of the first waveguide portion 123A1.

In some embodiments, as shown in FIG. 5B, the top surface 121A of the waveguide material 121 corresponding to one of the normal pixels P is smaller than and the top surface 121B of the waveguide material 121 corresponding to one of the additional normal pixels P1 in the area ROI-3 (or in area ROI-2), but the present disclosure is not limited thereto.

Since the normal pixels P surrounding the phase detection auto focus pixel PDAF may have higher sensitivity than other normal pixels P (e.g., the additional normal pixels P1) in area ROI-3 (or in area ROI-2), the sensitivity in area ROI-3 (or in area ROI-2) may be non-balanced. In the embodiments of the disclosure, the second waveguide width WW2 of the top of the second waveguide portion 123A2 is set to be greater than the first waveguide width WW1 of the top of the first waveguide portion 123A1, such that the difference of the sensitivities of the normal pixels P may be reduced. Therefore, the uniformity of the sensitivities in (or near) the edge area (peripheral area) of the solid-state imaging devices 400 may be improved.

In this embodiments, the waveguide partition grid 123A may have a third waveguide portion 123A3 corresponding to one of the additional normal pixels P1 in area ROI-3 (i.e., the edge area of the solid-state imaging device 400) as shown in FIG. 5B. Moreover, the second waveguide width WW2 of the top of the second waveguide portion 123A2 is greater than the third waveguide width WW3 of the top of the third waveguide portion 123A3, but the present disclosure is not limited thereto.

Figure 6A:
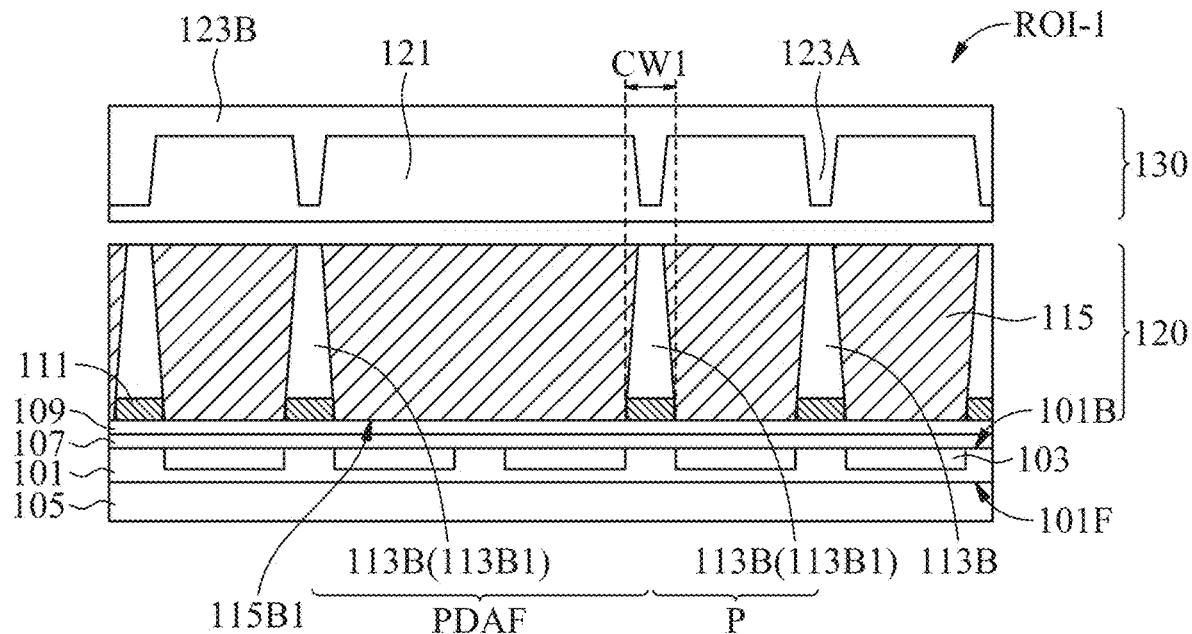
FIG. 6A is a partial cross-sectional view illustrating area ROI-1 of the solid-state imaging device according to some embodiments of the disclosure.
Figure 6B:
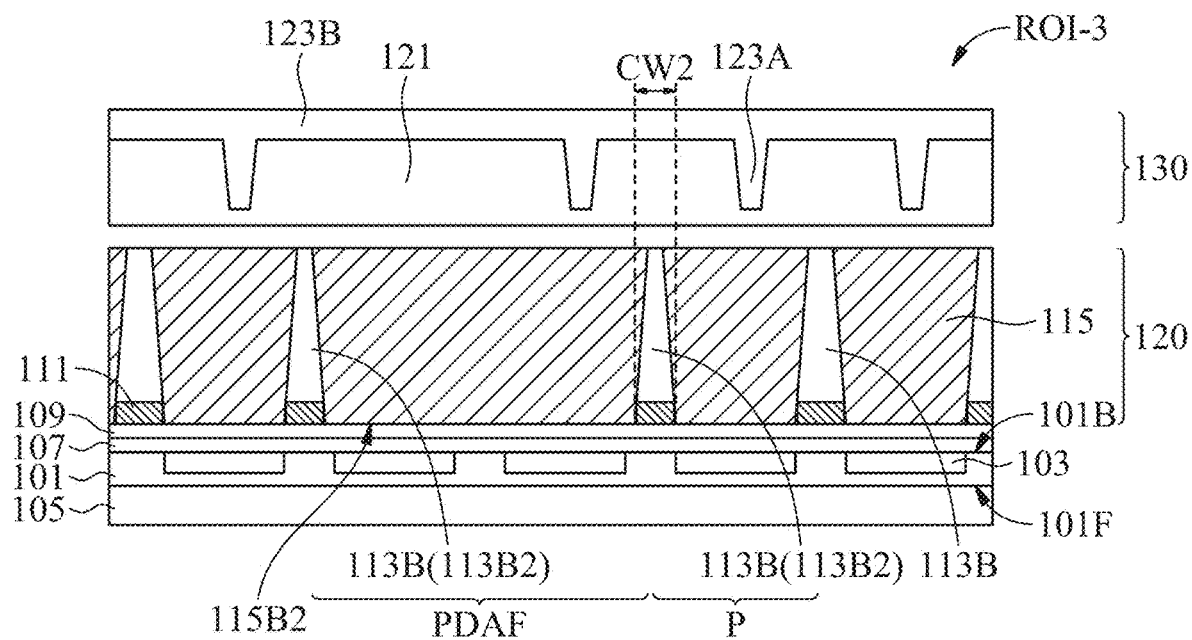
FIG. 6B is a partial cross-sectional view illustrating area ROI-3 of the solid-state imaging device according to some embodiments of the disclosure.

FIG. 6A is a partial cross-sectional view illustrating area ROI-1 of the solid-state imaging device 500 according to some embodiments of the disclosure. FIG. 6B is a partial cross-sectional view illustrating area ROI-3 of the solid-state imaging device 500 according to some embodiments of the disclosure. The relative positions of area ROI-1 and area ROI-3 in FIG. 6A and FIG. 6B may also be referred to in FIG. 1. It should be noted that some components of the solid-state imaging device 500 may be omitted in FIG. 6A and FIG. 6B for the sake of brevity.

Referring to FIG. 6A and FIG. 6B, in some embodiments, the photoelectric conversion elements 103 in the solid-state imaging device 500 may be arranged in a plurality of normal pixels P and a plurality of phase detection auto focus pixels PDAF surrounded by the normal pixels P. Similarly, each of the phase detection auto focus pixels PDAF may correspond to at least two of the photoelectric conversion elements 103, and each of the normal pixels P may correspond to one of the photoelectric conversion elements 103, but the present disclosure is not limited thereto.

In this embodiment, the color filter partition grid 113B has different widths in different areas of the solid-state imaging device 500. For example, as shown in FIG. 6A and FIG. 6B, the color filter partition grid 113B has a first color portion 113B1 in area ROI-1 (i.e., the central area of the solid-state imaging device 500) and a second color portion 113B2 corresponding to the first color portion 113B1 in area ROI-3 (i.e., the edge area of the solid-state imaging device 500), but the present disclosure is not limited thereto. In some other embodiments, the second color portion 113B2 of the color filter partition grid 113B may also be disposed in area ROI-2 (i.e., between the central area and the edge area of the solid-state imaging device 500).

In this embodiment, the first color portion 113B1 and the second color portion 113B2 of the color filter partition grid 113B correspond to spaces between one of the phase detection auto focus pixels PDAF and the corresponding normal pixels P (i.e., the normal pixels P surrounding the phase detection auto focus pixel PDAF). Moreover, the second color width CW2 of the bottom of the second color portion 113B2 is smaller than the first color width CW1 of the bottom of the first color portion 113B1.

In the embodiment shown in FIG. 6A and FIG. 6B, the bottom surface 115B2 of one of the color filter segments 115 enclosed by the second color portion 113B2 (that corresponds to a phase detection auto focus pixel PDAF in area ROI-3 of in area ROI-2) is greater than the bottom surface 115B1 of another of the color filter segments 115 enclosed by the first color portion 113B1 (that corresponds to a phase detection auto focus pixel PDAF in area ROI-1).

Since the normal pixels P surrounding the phase detection auto focus pixel PDAF may have higher sensitivity than other normal pixels P in area ROI-3 (or in area ROI-2), the sensitivity in area ROI-3 (or in area ROI-2) may be non-balanced. In the embodiments of the disclosure, the second color width CW2 of the bottom of the second color portion 113B2 is set to be smaller than the first color width CW1 of the bottom of the first color portion 113B1, such that the difference of the sensitivities of the normal pixels P may be reduced. Therefore, the uniformity of the sensitivities in (or near) the edge area (peripheral area) of the solid-state imaging devices 500 may be improved.

Figure 7A:
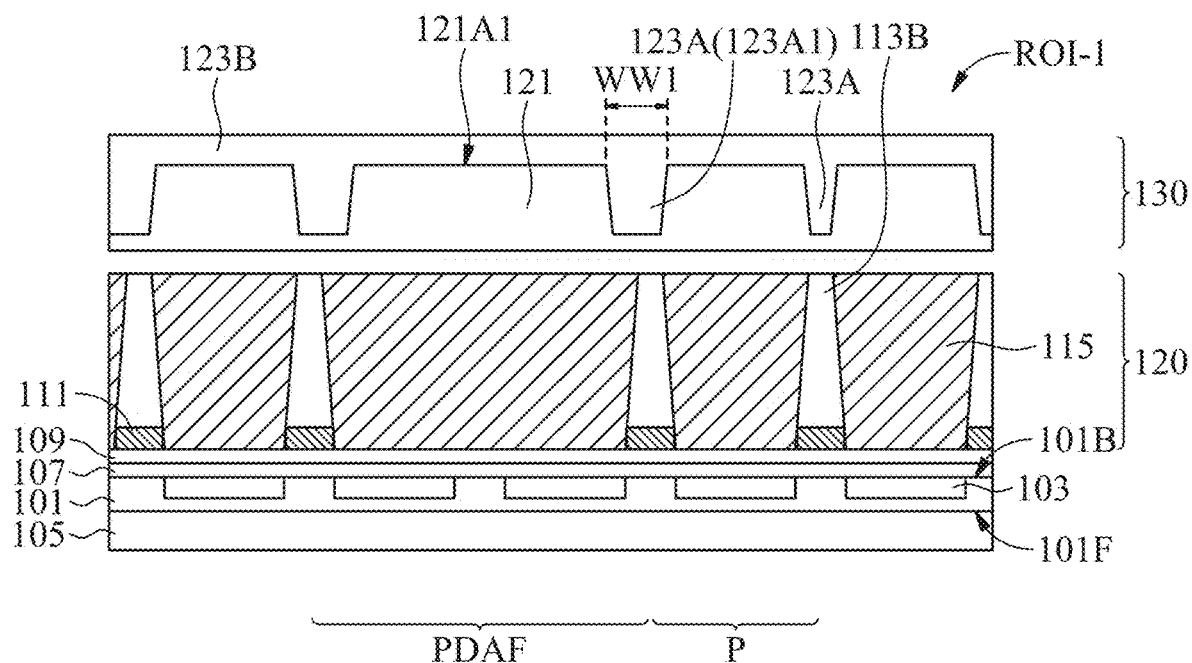
FIG. 7A is a partial cross-sectional view illustrating area ROI-1 of the solid-state imaging device according to some embodiments of the disclosure.
Figure 7B:
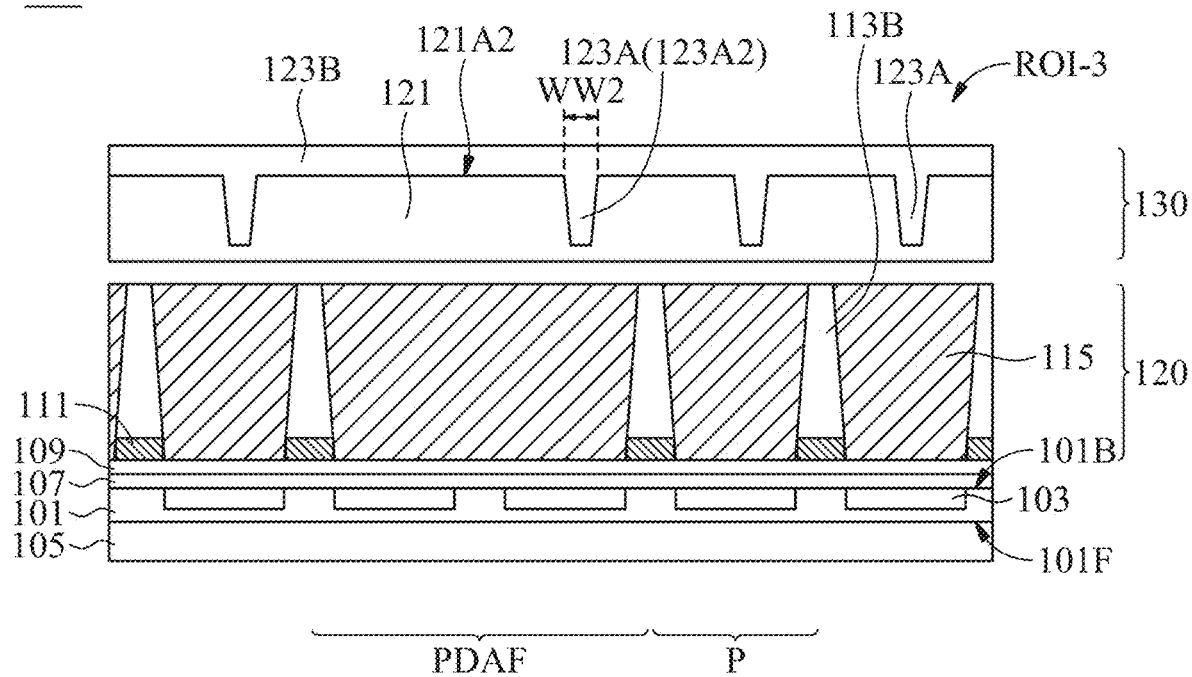
FIG. 7B is a partial cross-sectional view illustrating area ROI-3 of the solid-state imaging device according to some embodiments of the disclosure.

FIG. 7A is a partial cross-sectional view illustrating area ROI-1 of the solid-state imaging device 600 according to some embodiments of the disclosure. FIG. 7B is a partial cross-sectional view illustrating area ROI-3 of the solid-state imaging device 600 according to some embodiments of the disclosure. The relative positions of area ROI-1 and area ROI-3 in FIG. 7A and FIG. 7B may also be referred to in FIG. 1. It should be noted that some components of the solid-state imaging device 600 may be omitted in FIG. 7A and FIG. 7B for the sake of brevity.

Referring to FIG. 7A and FIG. 7B, in some embodiments, the photoelectric conversion elements 103 in the solid-state imaging device 600 may be arranged in a plurality of normal pixels P and a plurality of phase detection auto focus pixels PDAF surrounded by the normal pixels P. Similarly, each of the phase detection auto focus pixels PDAF may correspond to at least two of the photoelectric conversion elements 103, and each of the normal pixels P may correspond to one of the photoelectric conversion elements 103, but the present disclosure is not limited thereto.

In this embodiment, the waveguide partition grid 123A has different widths in different areas of the solid-state imaging device 600. For example, as shown in FIG. 7A and FIG. 7B, the waveguide partition grid 123A has a first waveguide portion 123A1 in area ROI-1 (i.e., the central area of the solid-state imaging device 600) and a second waveguide portion 123A2 corresponding to the first waveguide portion 123A1 in area ROI-3 (i.e., the edge area of the solid-state imaging device 600), but the present disclosure is not limited thereto. In some other embodiments, the second waveguide portion 123A2 of the waveguide partition grid 123A may also be disposed in area ROI-2 (i.e., between the central area and the edge area of the solid-state imaging device 600).

In this embodiment, the first waveguide portion 123A1 and the second waveguide portion 123A2 of the waveguide partition grid 123A correspond to spaces between one of the phase detection auto focus pixels PDAF and the corresponding normal pixels P (i.e., the normal pixels P surrounding the phase detection auto focus pixel PDAF). Moreover, the first waveguide width WW1 of the top of the first waveguide portion 123A1 is greater than the second waveguide width WW2 of the top of the second waveguide portion 123A2.

As shown in FIG. 7A and FIG. 7B, in some embodiments, the top surface 121A1 of the waveguide material 121 enclosed by the first waveguide portion 123A1 (that corresponds to a phase detection auto focus pixel PDAF in area ROI-1) is smaller than the top surface 121A2 of the waveguide material 121 enclosed by the second waveguide portion 123A2 (that corresponds to a phase detection auto focus pixel PDAF in area ROI-3 of in area ROI-2).

In the embodiments of the disclosure, the first waveguide width WW1 of the top of the first waveguide portion 123A1 is set to be greater than the second waveguide width WW2 of the top of the second waveguide portion 123A2, such that the uniformity of the sensitivities of the solid-state imaging devices 600 may be improved.

Figure 8A:
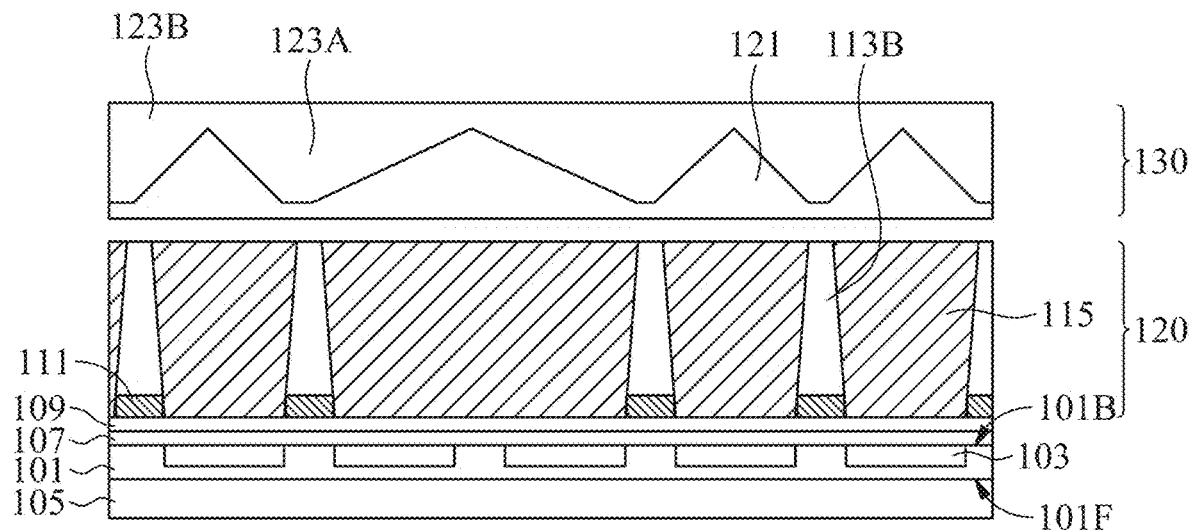
FIG. 8A is a partial cross-sectional view illustrating the solid-state imaging device according to some embodiments of the disclosure.
Figure 8B:
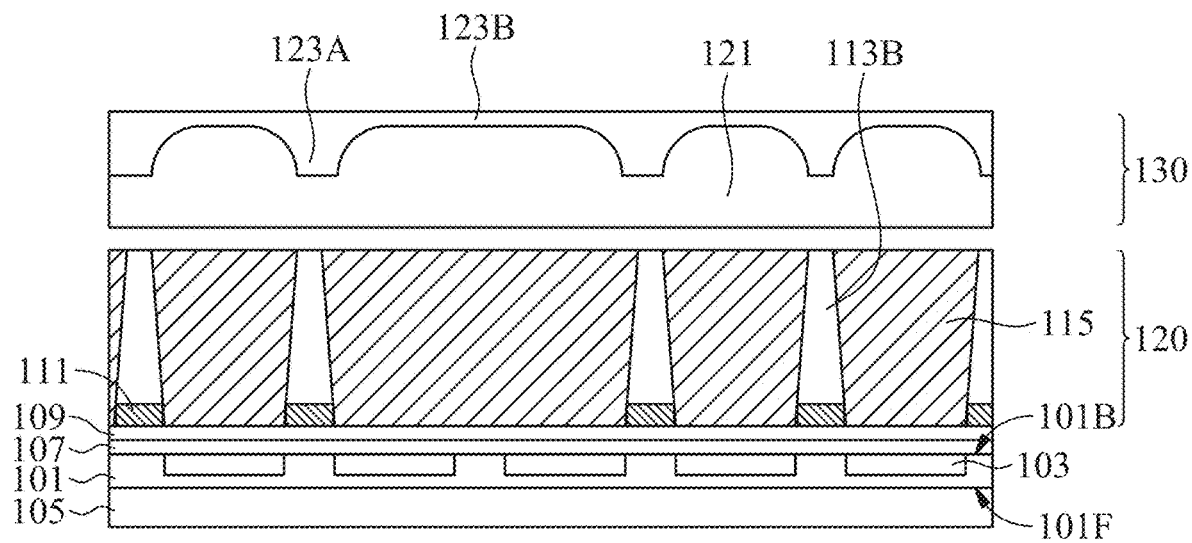
FIG. 8B is a partial cross-sectional view illustrating the solid-state imaging device according to some embodiments of the disclosure.

FIG. 8A is a partial cross-sectional view illustrating the solid-state imaging device 700 according to some embodiments of the disclosure. FIG. 8B is a partial cross-sectional view illustrating the solid-state imaging device 800 according to some embodiments of the disclosure. It should be noted that some components of the solid-state imaging device 700 or the solid-state imaging device 800 may be omitted in FIG. 8A and FIG. 8B for the sake of brevity.

As shown in FIG. 8A, the profile of each of the waveguide materials 121 in the spaces may be a triangle shape; as shown in FIG. 8B, the profile of each of the waveguide materials 121 in the spaces may be an arc shape, but the present disclosure is not limited thereto. In some embodiments, each of the waveguide materials 121 in the spaces may have a profile including a rectangular shape, a triangle shape, other polygon shapes, an arc shape, or a combination thereof.

In summary, according to the embodiments of the present disclosure, by adjusting the widths of some components in the solid-state imaging device, the difference of the sensitivities of the color filter segments may be reduced. Therefore, the uniformity of the sensitivities in (near) the edge or the peripheral area of the solid-state imaging devices may be improved.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A solid-state imaging device having a first area and a second area surrounding the first area, comprising:
    a substrate having a plurality of photoelectric conversion elements;
    a color filter layer disposed on the substrate, and comprising a plurality of color filter segments corresponding to the plurality of photoelectric conversion elements; and
    an optical waveguide layer over the color filter layer, and comprising a waveguide partition grid, a waveguide material in spaces of the waveguide partition grid, and an anti-reflection film on the waveguide partition grid and the waveguide material,
    wherein a width of a top of the waveguide partition grid is larger than a width of a bottom of the waveguide partition grid,
    wherein the waveguide partition grid has a first waveguide portion in the first area and a second waveguide portion corresponding to the first waveguide portion in the second area, and a second waveguide width of a top of the second waveguide portion is greater than a first waveguide width of a top of the first waveguide portion,
    wherein the plurality of color filter segments comprise a plurality of red color filter segments and a plurality of green color filter segments and/or blue color filter segments, the first waveguide portion and the second waveguide portion enclose spaces corresponding to the plurality of red color filter segments, and a top surface of the waveguide material corresponding to each of the plurality of red color filter segments is smaller than a top surface of the waveguide material corresponding to each of the plurality of green color filter segments and/or blue color filter segments in the second area.

2. The solid-state imaging device as claimed in claim 1, wherein a ratio of the second waveguide width to the first waveguide width is from 1.05 to 1.3.

3. The solid-state imaging device as claimed in claim 1, wherein the waveguide material in the spaces has a profile comprising a rectangular shape, a triangle shape, an arc shape, or a combination thereof.

4. A solid-state imaging device having a first area and a second area surrounding the first area, comprising:
    a substrate having a plurality of photoelectric conversion elements;
    a color filter layer disposed on the substrate, and comprising a plurality of color filter segments corresponding to the plurality of photoelectric conversion elements; and
    an optical waveguide layer over the color filter layer, and comprising a waveguide partition grid, a waveguide material in spaces of the waveguide partition grid, and an anti-reflection film on the waveguide partition grid and the waveguide material,
    wherein a width of a top of the waveguide partition grid is larger than a width of a bottom of the waveguide partition grid,
    wherein the plurality of photoelectric conversion elements are arranged in a plurality of normal pixels and a plurality of phase detection auto focus pixels surrounded by the plurality of normal pixels, each of the plurality of phase detection auto focus pixels corresponds to at least two of the plurality of photoelectric conversion elements, and each of the plurality of normal pixels corresponds to one of the plurality of photoelectric conversion elements.

5. The solid-state imaging device as claimed in claim 4, wherein the color filter layer further comprises a metal grid deposed between the plurality of color filter segments, the metal grid has a first metal portion in the first area and a second metal portion corresponding to the first metal portion in the second area, and a second metal width of the second metal portion is greater than a first metal width of the first metal portion.

6. The solid-state imaging device as claimed in claim 5, wherein the first metal portion and the second metal portion correspond to spaces between one of the plurality of phase detection auto focus pixels and the plurality of normal pixels surrounding the one of the plurality of phase detection auto focus pixels.

7. The solid-state imaging device as claimed in claim 6, wherein the plurality of color filter segments cover part of the second metal portion in the normal pixels.

8. The solid-state imaging device as claimed in claim 6, wherein the color filter layer further comprises a color filter partition grid disposed between the plurality of color filter segments and on the metal grid, and the color filter partition grid has a grid width that is smaller than the second metal width of the second metal portion.

9. The solid-state imaging device as claimed in claim 5, wherein a ratio of the second metal width to the first metal width is 1.2 to 1.75.

10. The solid-state imaging device as claimed in claim 4, wherein the waveguide partition grid has a first waveguide portion in the first area and a second waveguide portion corresponding to the first waveguide portion in the second area, and a second waveguide width of a top of the second waveguide portion is greater than a first waveguide width of a top of the first waveguide portion.

11. The solid-state imaging device as claimed in claim 10, wherein the first waveguide portion and the second waveguide portion correspond to spaces between one of the plurality of phase detection auto focus pixels and the plurality of normal pixels surrounding the one of the plurality of phase detection auto focus pixels.

12. The solid-state imaging device as claimed in claim 11, wherein the color filter layer further comprises a color filter partition grid disposed between the plurality of color filter segments.

13. The solid-state imaging device as claimed in claim 12, wherein the plurality of photoelectric conversion elements are further arranged in a plurality of additional normal pixels separated from the plurality of phase detection auto focus pixels by the plurality of normal pixels, a top surface of the waveguide material corresponding to one of the plurality of normal pixels is smaller than and a top surface of the waveguide material corresponding to one of the plurality of additional normal pixels in the second area.

14. The solid-state imaging device as claimed in claim 4, wherein the color filter layer further comprises a color filter partition grid disposed between the color filter segments, the color filter partition grid has a first color portion in the first area and a second color portion corresponding to the first color portion in the second area, and a second color width of a bottom of the second color portion is smaller than a first color width of a bottom of the first color portion.

15. The solid-state imaging device as claimed in claim 14, wherein the first color portion and the second color portion correspond to spaces between one of the plurality of phase detection auto focus pixels and the plurality of normal pixels surrounding the one of the plurality of phase detection auto focus pixels.

16. The solid-state imaging device as claimed in claim 15, wherein a bottom surface of one of the plurality of color filter segments enclosed by the second color portion is greater than a bottom surface of another of the plurality of color filter segments enclosed by the first color portion.

17. The solid-state imaging device as claimed in claim 4, wherein the waveguide partition grid has a first waveguide portion in the first area and a second waveguide portion corresponding to the first waveguide portion in the second area, and a first waveguide width of a top of the first waveguide portion is greater than a second waveguide width of a top of the second waveguide portion.

18. The solid-state imaging device as claimed in claim 17, wherein a top surface of the waveguide material enclosed by the first waveguide portion is smaller than a top surface of the waveguide material enclosed by the second waveguide portion.

\* \* \* \* \*